US005589832A

United States Patent [19]
Grundvig et al.

[11] Patent Number: 5,589,832
[45] Date of Patent: Dec. 31, 1996

[54] LOW NOISE NON-SAMPLED SUCCESSIVE APPROXIMATION

[75] Inventors: Jeffrey P. Grundvig; David G. Vallancourt, both of Macungie, Pa.

[73] Assignee: Lucent Technologies Inc., Murray Hill, N.J.

[21] Appl. No.: 349,153

[22] Filed: Dec. 2, 1994

[51] Int. Cl.$^6$ .................................................. H03M 1/38
[52] U.S. Cl. ........................... 341/161; 341/164; 341/118
[58] Field of Search .................................... 341/161–165, 341/156, 118; 377/42, 43

[56] References Cited

U.S. PATENT DOCUMENTS

| | | | |
|---|---|---|---|
| 4,176,344 | 11/1979 | Saari et al. | 340/347 DA |
| 4,313,204 | 1/1982 | DeFreitas | 375/28 |
| 4,544,914 | 10/1985 | Chan et al. | 341/155 |
| 4,593,270 | 6/1986 | White | 340/347 AD |
| 4,620,179 | 10/1986 | Cooper et al. | 340/347 AD |
| 4,647,903 | 3/1987 | Ryu | 340/347 AD |
| 4,688,018 | 8/1987 | Vaughn | 340/347 AD |
| 4,707,682 | 11/1987 | Brokaw et al. | 340/347 AD |
| 4,761,636 | 8/1988 | Brokaw et al. | 340/347 AD |
| 4,777,470 | 10/1988 | Naylor et al. | 341/161 |
| 4,852,130 | 7/1989 | Draxelmayr | 377/81 |
| 4,897,658 | 1/1990 | Fujii et al. | 341/161 |
| 4,907,002 | 3/1990 | Kawada | 341/172 |
| 4,908,624 | 3/1990 | Goto et al. | 341/172 |
| 4,940,981 | 7/1990 | Naylor et al. | |
| 4,983,969 | 1/1991 | Iwamoto et al. | 341/118 |
| 4,985,702 | 1/1991 | Penney | 341/118 |
| 4,989,004 | 1/1991 | Kanayama | 341/161 |
| 5,092,330 | 3/1992 | Duggan | 128/630 |
| 5,107,504 | 4/1992 | Nakamura et al. | 371/37.1 |
| 5,206,650 | 4/1993 | Parle et al. | 341/163 |
| 5,235,333 | 8/1993 | Naylor et al. | 341/118 |
| 5,258,759 | 11/1993 | Cauwenberghs et al. | 341/150 |
| 5,282,152 | 1/1994 | Caviasca et al. | 364/713.01 |
| 5,287,108 | 2/1994 | Mayes et al. | 341/156 |
| 5,303,177 | 4/1994 | Andre et al. | 364/264 |
| 5,325,319 | 6/1994 | Andre et al. | 364/724.19 |

Primary Examiner—Jeffrey A. Gaffin
Assistant Examiner—Jason L. W. Kost

[57] ABSTRACT

A successive approximation circuit and method are disclosed for digitally approximating a moving signal using an analog-digital converter (ADC) and a comparator for generating a comparison signal from the moving signal. An estimate register and a bit and conversion control circuit are provided, with the bit and conversion control circuit including a bit control circuit and a conversion control circuit, where the bit control circuit adjusts a current plurality of output bits to compensate for an error due to a slew rate to generate the digitally approximated moving signal. An adder is included for adding the control value to the current plurality of output bits to generate the next plurality of output bits. Alternatively, an adjustment selection circuit and a logic chain circuit are included. A successive approximation circuit and method are also disclosed for reducing noise in the approximation including a bit tap circuit having a tap converter, which responds to the plurality of output bits and an adjustment circuit for adjusting the bit taps to have reduced noise in the output estimate. The bit tap circuit converts the adjustment signal to an extra least significant bit (LSB) tap of the final plurality of bit taps. Alternatively, the bit tap circuit converts the adjustment signal to a first bit tap corresponding to a most significant bit (MSB) of the plurality of output bits. In another embodiment, the bit tap circuit includes a plurality of AND gates and a plurality of OR gates.

20 Claims, 7 Drawing Sheets

LOW NOISE NON-SAMPLED SUCCESSIVE APPROXIMATION

BACKGROUND OF THE INVENTION

1. Field of the Invention

This disclosure relates to analog-to-digital converters (ADC), and more particularly, to successive approximation circuits and methods for performing ADC functions on non-sampled or moving signals.

2. Description of the Related Art

Successive approximation is a method of analog-to-digital conversion in which the signal to be converted (i.e. an unknown quantity) is compared repeatedly against a group of weighted references which are chosen from a digital estimation circuit under program control. Typically, the references are weighted in binary sequence, i.e. each weight is twice that of the next smallest, so that the outcome of the completed conversion is directly obtained from the state of the estimation array at the end of a conversion.

The algorithm, or program, used to select from among the weighted references is similar to that used to weigh an object on a balance using a set of reference weights. These weights are tried in order starting with the heaviest, which by definition is a half scale initial guess. Any weight which tips the scale is removed, and at the end of the process, the sum of the weights remaining on the scale is within one smallest reference unit of the unknown's actual weight.

In prior successive approximation A/D converters it is assumed that the unknown value does not change during the course of the conversion. Accordingly, a sample and hold circuit is used to "freeze" the value of the unknown when conversion is in process.

If the unknown is allowed to continue changing during conversion, the normal successive approximation process must be modified to enable the converter to follow the unknown signal and to compensate for possible changes in the unknown between conversion steps. Furthermore, the digital estimate must be constructed in such a way that a minimum number of circuit elements switch at the end of conversion when the smallest values are being determined. This is because circuit switching is unavoidably accompanied by electrical noise, and such noise tends to interfere with the circuits which generate the reference and which compare the reference to the unknown, thus limiting the resolution of the converter.

SUMMARY

A successive approximation circuit is disclosed which includes the following elements:

A) a conversion control circuit which, at each active clock edge, generates a control bus output, which in turn is used to generate the next digital estimate;

B) an estimate register, such as a flip-flop circuit which stores a current digital estimate that is updated at each active clock edge, and which sends the digital estimate to a bit tap circuit;

C) a bit control circuit which generates the next digital estimate based on the current estimate and the current control output. The bit control circuit may be described generally as an adder/subtracter which adds or subtracts the control value with/from the current estimate based on whether a comparator's output is high or low; and D) a bit tap circuit which generates control signals (taps) for analog elements in a DAC which produces an analog estimate, which is compared with actual unknown analog input signal by the comparator to form the LOW_HIB signal. Exemplary embodiments are shown in FIGS. 1–6. In FIG. 2, a bit and conversion control circuit includes a bit control circuit and a conversion control circuit. The bit control circuit is a basic adder/subtracter, and the conversion control circuit is a combination of a counter followed by a decoder where the control output is a typical or vanilla decoder output value with the exception that the least significant bit (LSB) decoder output is modified with an OR gate to compensate for possible slew rate errors at a predetermined cycle in the conversion. In FIG. 2 this compensation cycle is shown as cycle 4. This is the fastest possible method in terms of number of clock cycles required to complete the successive approximation conversion, and requires the same number of cycles as the number of bits.

Figure 3:
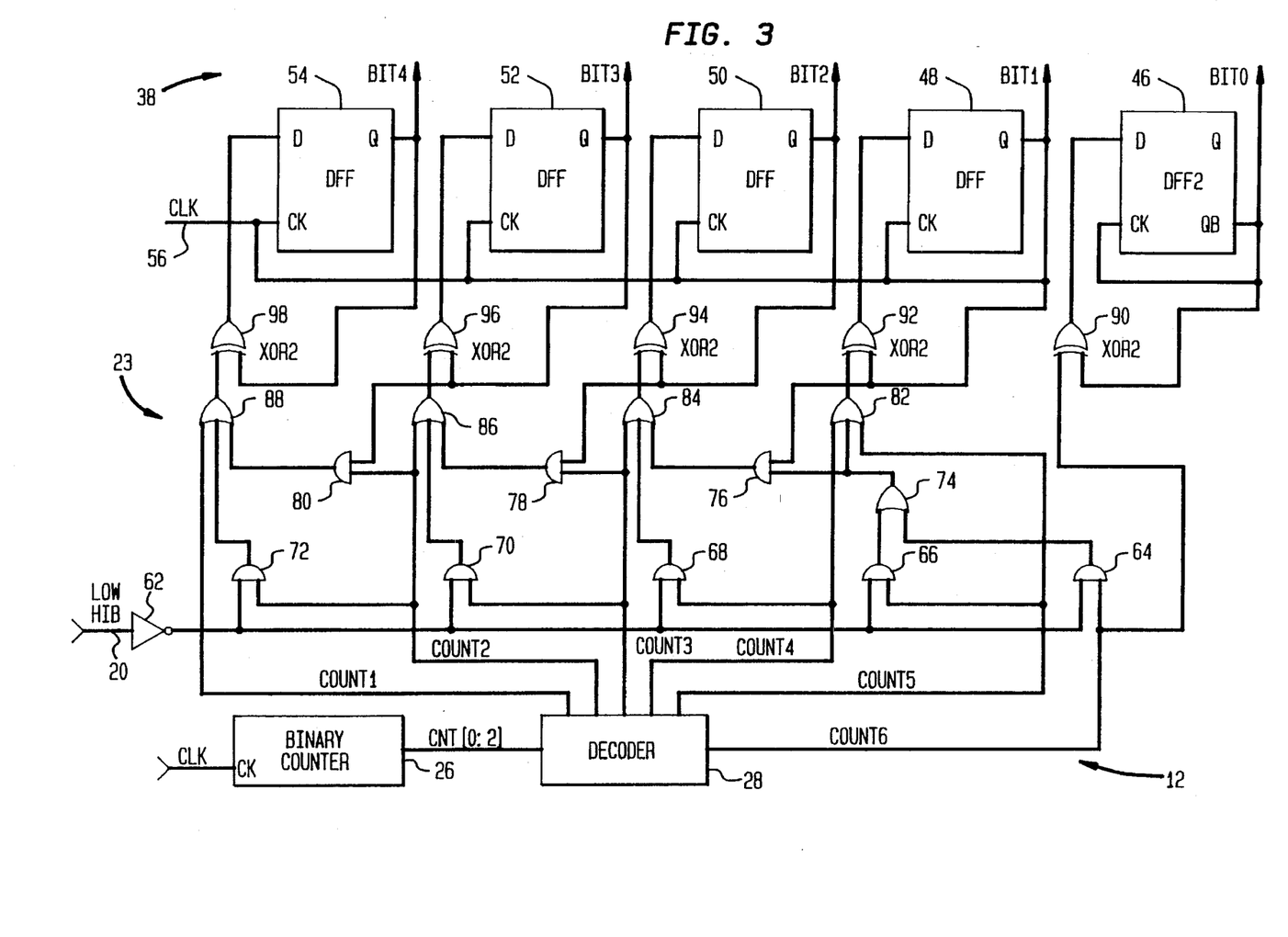
FIG. 3 illustrates a second embodiment of the successive approximation circuit.

FIG. 3 shows a bit and conversion control circuit which is simplified by adding extra cycles at predetermined times (based on slew rate/clock rate) to effectively repeat the addition/subtraction of a particular value. Addition and subtraction in this case are performed by simply setting and clearing bits based on the control value and the LOW_HIB signal, until the predetermined "extra" cycle is performed. When this extra cycle is reached, adding the previous value is performed with a simple AND chain, and subtracting the previous value is done by clearing the last bit which was just set on the immediately previous active clock edge. In FIG. 3 this extra cycle is shown, for example, as cycle 5.

At the time the final digital estimate is set, it is desirable for the system to be "quiet" to determine accurately the final answer. At this point only an LSB adjustment is necessary to the output estimate. In order to avoid the condition where adding one more LSB could ripple through to the upper most significant bits (MSBs), potentially changing many output taps, the bit tap and bit and conversion control circuits are modified to allow only one LSB value to be modified at the last clock cycle. To do so, an add-one-more signal which is conditionally generated at the last conversion cycle from the bit and conversion control circuit is used to modify at most only one output tap.

Figure 4:
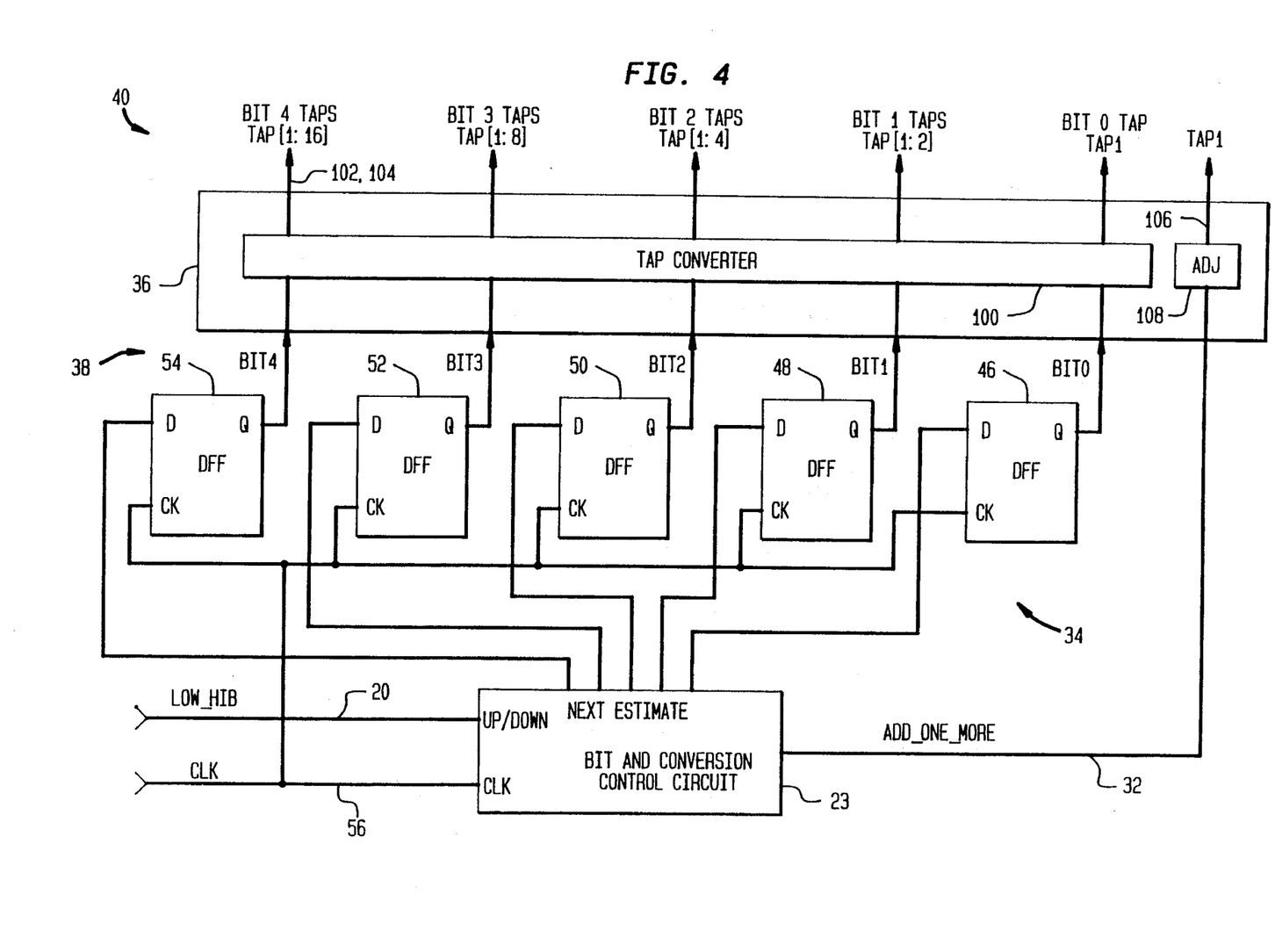
FIG. 4 illustrates a first embodiment of the bit tap circuit for use with the successive approximation circuit.

The exemplary circuit shown in FIG. 4 generates an extra tap control not related to the taps coming from the other output estimate bits which would then "turn on" an additional analog element in the DAC having the value of one LSB.

Figure 5:
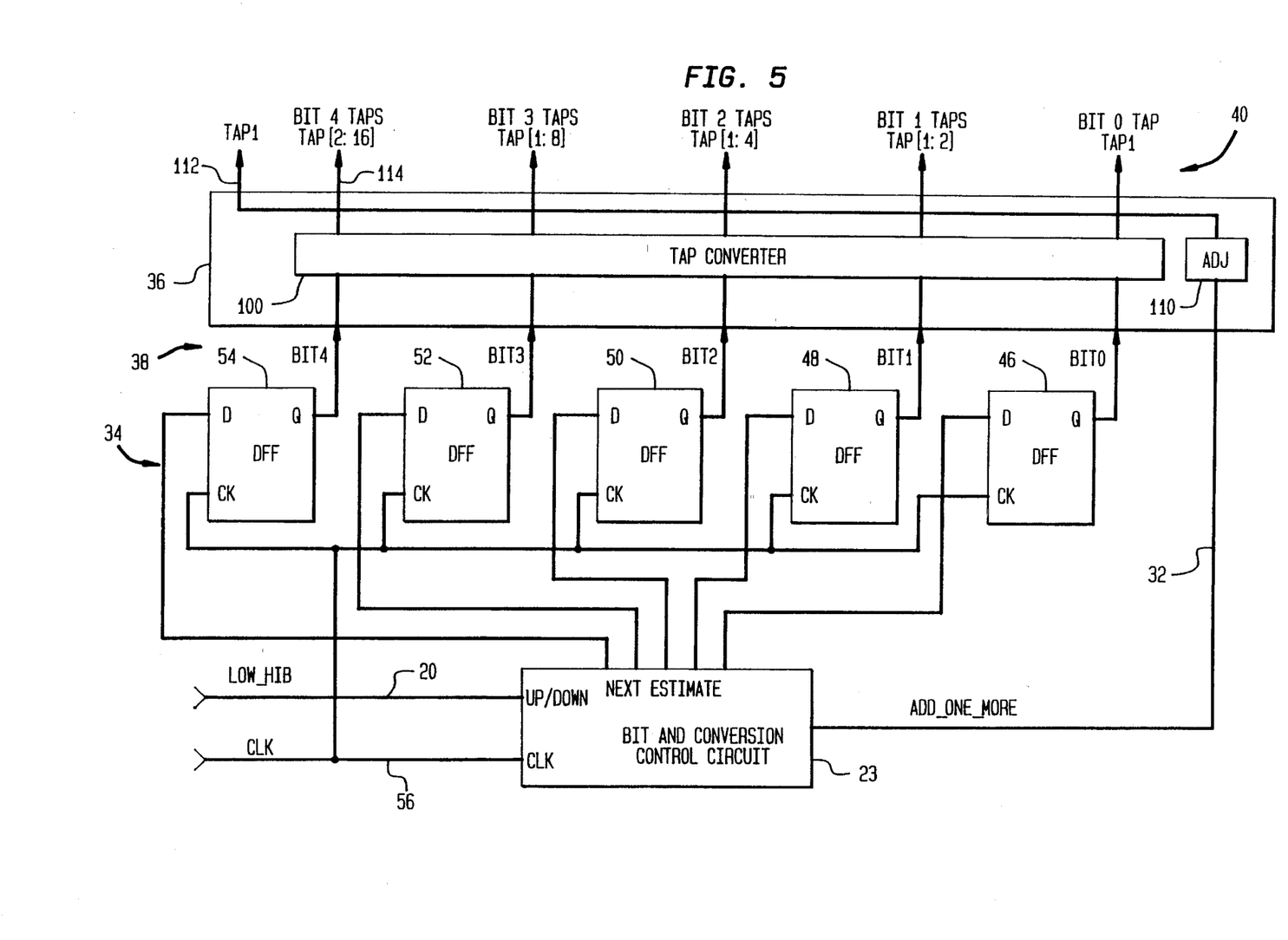
FIG. 5 illustrates a second embodiment of the bit tap circuit for use with the successive approximation circuit.

The exemplary circuit shown in FIG. 5 turns on one tap of the estimate register's most significant bit's fanout taps which had previously been left off. The exemplary circuit shown in FIG. 6 turns on one tap of one of the estimate register bits which was not on already, where an AND chain configuration determines which bit's tap should be turned on.

BRIEF DESCRIPTION OF THE DRAWINGS

The features of the disclosed successive approximation circuit and method will become more readily apparent and may be better understood by referring to the following detailed description of an illustrative embodiment of the present invention, taken in conjunction with the accompanying drawers, where.

DESCRIPTION OF THE PREFERRED EMBODIMENTS

Figure 1:
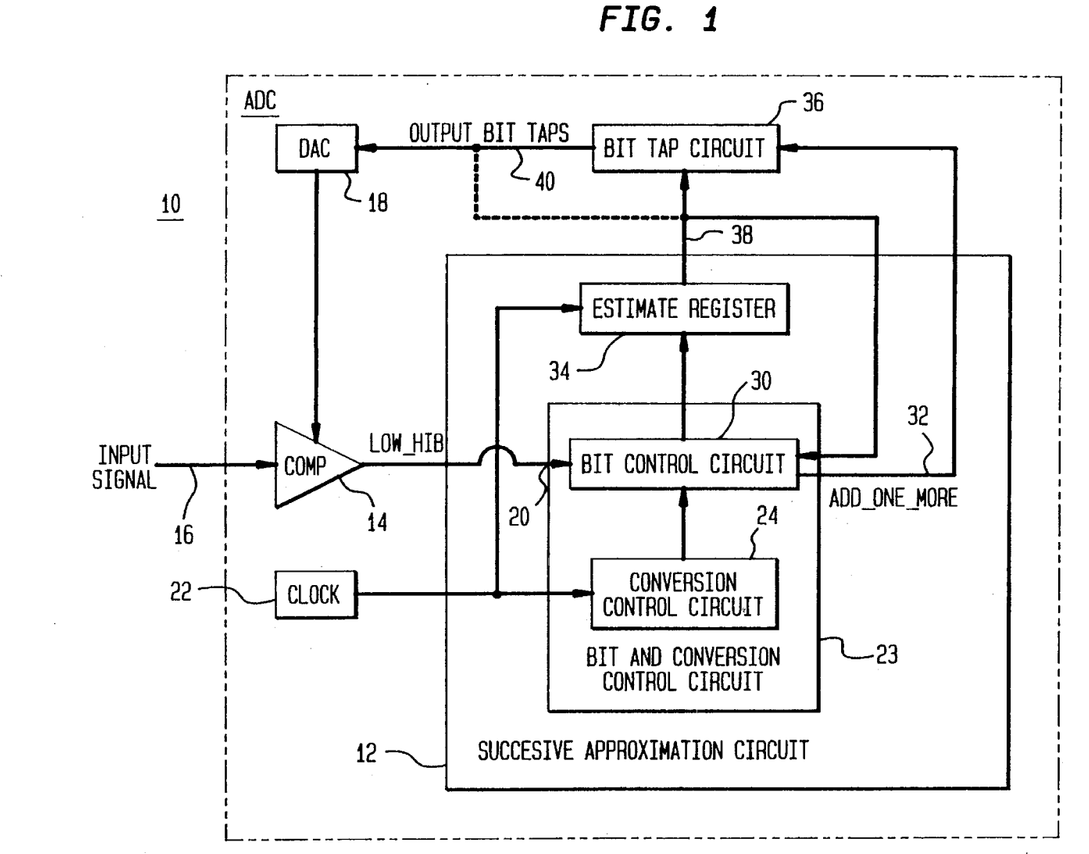
FIG. 1 illustrates the components of the successive approximation circuit disclosed herein.
Figure 2:
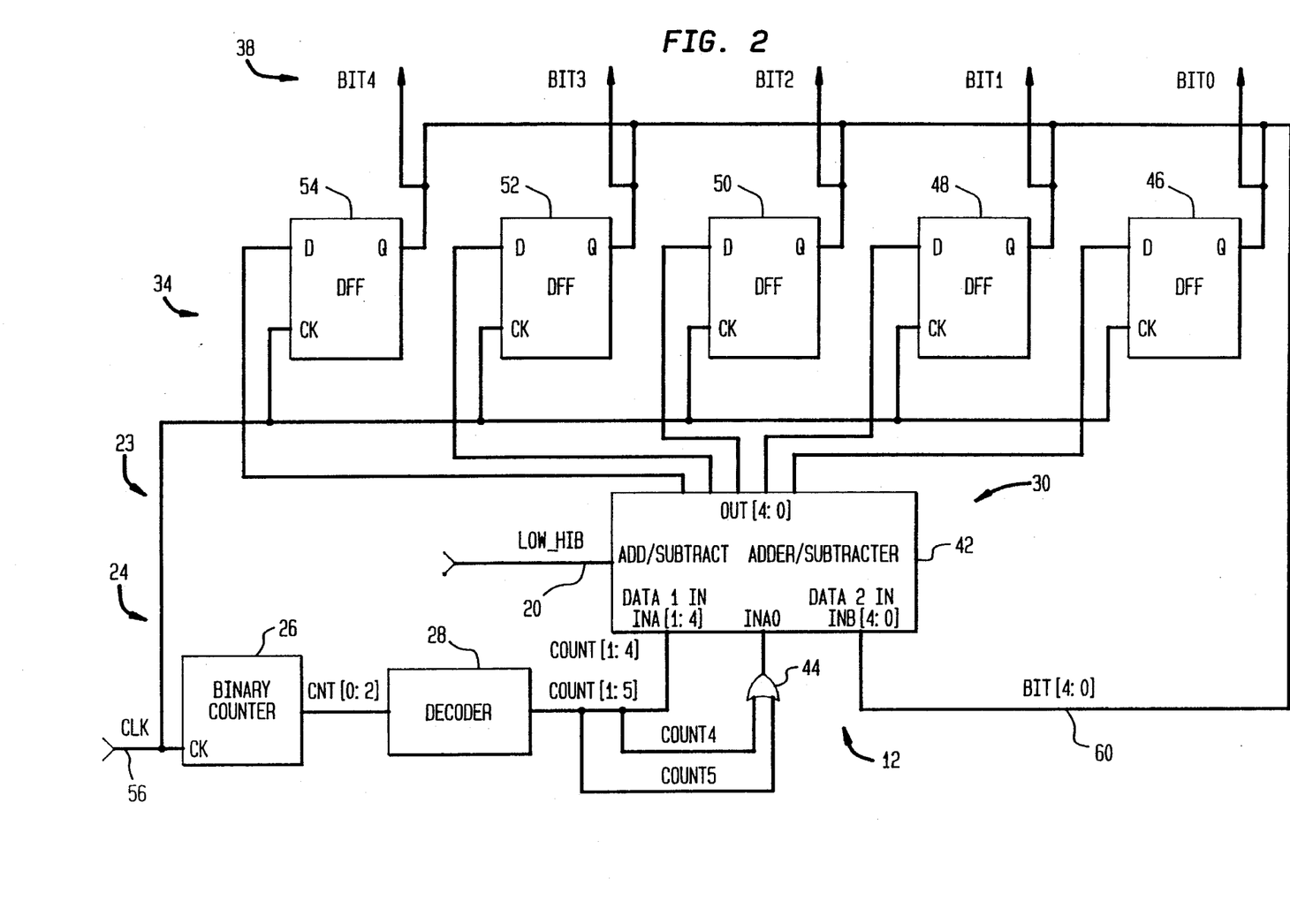
FIG. 2 illustrates a first embodiment of the successive approximation circuit.

Referring now in specific detail to the drawings, with like reference numerals identifying similar or identical elements, as shown in FIG. 1, the present disclosure relates to a successive approximation circuit for digitally approximating an input moving signal (or non- signal) using an analog-digital converter (ADC) 10. The successive approximation circuit 12 is connected to a comparator 14 which receives the input moving signal 16 and a feedback signal from a digital-analog converter (DAC) 18 for generating a comparison signal 20 termed LOW_HIGH BAR or LOW_HIB from the moving signal. The successive approximation circuit 12 is also connected to a source 22 of a clock signal for clocking the successive approximation circuit 12 and the estimate register 34.

The successive approximation circuit 12 includes a bit and conversion control circuit 23 having a conversion control circuit 24 which may include a counter 26 and a decoder 28, as shown in FIGS. 2–3. The conversion control circuit 24 keeps track of the current state in the conversion process; i.e. the successive approximation cycle.

The bit and conversion control circuit also includes a bit control circuit 30 which responds to the control signals and the LOW_HIB signal, for generating a control value. The bit control circuit 30 controls a flip-flop circuit 34 to generate a first plurality of output bits, and the plurality of output bits 38 are fed back to the bit control circuit 30. Prior to the conversion or successive approximation procedure, the initial state of the flip-flop circuit 34 is logical zero.

The bit control circuit 30 then responds to the control value, the comparison signal, and the previous plurality of output bits to adjust the previous plurality of output bits to compensate for an error due to a slew rate to modify the previous estimate and to cause the flip-flop circuit 34 to generate a next plurality of output bits as the digitally approximated moving signal.

A bit tap circuit 36 is connected to the flip-flop circuit 34 and receives the output bits 38 from the flip-flop circuit 34 to generate a plurality of output bit taps 40; i.e. analog switch control signals. The output bits 38 are provided to the DAC 18 through the bit tap circuit 36, or optionally to the DAC 18 from a connection to the flip-flop circuit 34, as indicated by the dashed lines in FIG. 1. The feedback of the output bits 38 through the DAC 18 to the comparator 14 determines the $LOW_{13}HIB$ signal for performing a successive iteration to approximate the input moving signal 16.

In particular, the LOW_HIB signal (or LOW_$\overline{HIGH}$) is LOW (or logical 0) when the approximation is too high and is HIGH (or logical 1) when the approximation is too low.

FIG. 2 illustrates a first embodiment of the successive approximation circuit. In the first embodiment, the bit control circuit 30 includes an adder, which may be an adder-subtracter 42 such as a generic adder as known in the art and capable of performing subtraction operations. The adder 42 receives the first plurality of output bits from the flip-flop circuit 34 and which responds to the control signal, the control value, and the comparison signal; i.e. the LOW_HIB signal, for adding or subtracting the control value to the first plurality of output bits to cause the flip-flop circuit 34 to generate the next plurality of output bits.

In an exemplary embodiment, the bit control circuit 30 includes an OR gate 44 for receiving count signals to indicate to the adder 42 that a current decoder value is to be added or subtracted as a control value. In particular, the bit and conversion control circuit 23 responds to a counting cycle to generate a plurality of counts (COUNT1, COUNT2, etc.) as control signals which are input to a first data input of the adder 42. This first data input is then added or subtracted from the second data input of the current estimate, based on the value of LOW HIB. When the maximum slew rate at an $i^{th}$ count drifts more than one least significant bit (LSB) away from an accurate approximation, the OR gate 44 indicates to the adder on the $i^{th}$ iteration to add/subtract an additional LSB 42; i.e. the conversion control circuit 24 indicates to the adder 42 to add or subtract the current decoder value and an LSB, as indicated by the decoder counts, as a control value. In an exemplary embodiment, referring to FIG. 2, COUNT4 and COUNT5 are input to the OR gate 44 for generating a signal to instruct the adder 42 to add the decoder value and an LSB at the fourth count or cycle of the conversion iterations.

It is understood that the adder 42 may also implement a subtracter to perform subtracting functions, where, as determined by the comparator 14 using the comparison signal, the current decoder value is subtracted to adjust the output bits as needed.

As shown in FIG. 2, in a exemplary embodiment, the flip-flop circuit 34 includes a plurality of flip-flops. In the exemplary embodiment, the flip-flop circuit 34 includes five flip-flops 46–54 for generating output bits BIT0 to BIT4, with BIT0 as a least significant bit (LSB) and BIT4 as a most significant bit (MSB).

For example, each of the flip-flops 46–54 are D flip-flops clocked by clock signal 56 from the clock source 22. Each output bit of the flip-flops 46–54 are fed back over a series of lines or a bus 60 to a second input of the adder 42.

FIG. 3 illustrates a second 5 bit exemplary embodiment of the bit and conversion control circuit 23 for use in the successive approximation circuit 12. In this example, BIT0 is generated by the inverted output or QB of flip-flop 46. An inverter 62 is provided for inverting the LOW_HIB signal, and a first plurality of AND gates 64–72 respond to the inverted LOW_HIB signal and the plurality of control bits to generate AND output signals including a first, second, and at least third AND output signal, by respectively ANDing the inverted comparison signal and a respective control bit.

An adjustment selection circuit is provided to respond to the control signal and the first and second AND output signal to generate a next adjustment signal. In an exemplary embodiment, the adjustment selection circuit includes an OR gate 74 for ORing the first and second AND output signals to generate the first adjustment signal. In the exemplary embodiment shown in FIG. 3, the control signals determine that the AND output signals of AND gates 64, 66 are applied to the OR gate 74 for input to a logic gate chain to assert the fourth count to adjust the value of output bit BIT1.

In the exemplary embodiment of FIG. 3, the logic chain circuit includes a plurality of AND gates 76–80 in series, with the first adjustment signal applied to the AND gates and responsive to the at least third AND output signal and the first adjustment signal from the OR gate 74 for controlling the flip-flop circuit 34 to add the control value to the previous plurality of output bits to generate the next plurality of output bits. In this example, the adjustment signal adjusts for slew rate at the fifth iteration.

The first AND gate 76 in the chain performs an AND function for ANDing a first output bit and the first adjustment signal to generate a first chain AND output, and each successive AND gate 78–80 in series performs AND functions for ANDing a respective output bit and an output of a preceding AND gate to generate a respective chain AND output. Each chain AND output, i.e. the outputs of AND gates 76–80, are respectively input to a plurality of OR gates 82–88 in a chain.

A first OR gate 82 receives the first adjustment signal from the OR gate 74 and the COUNT4 and COUNT5 signals for ORing the input signals to generate a first chain OR output. The at least second OR gates 84–88 receives a respective chain AND output, a respective output of the at least third AND gates 68–72, and respective counts COUNT1, COUNT2, etc., to generate at least a second chain OR output signal.

The logic chain circuit further includes a plurality of exclusive-OR gates 90–98. Each exclusive-OR gate has a first input connected to the output of a respective flip-flop 46–54. A first exclusive-OR gate 90 receiving a first count signal COUNT6 and the BIT0 value from the inverted output QB of flip-flop 90. Each successive exclusive-OR gate 92–98 receives the output Q of each flip-flop 48–54, respectively, and a respective OR chain output at a second input connected to respective OR gates 84–88. Each output of the exclusive-OR gates 90–98 controls the flip-flops 44–52 to adjust the output bits to generate a next plurality of output bits 38 to approximate the moving signal.

In the embodiments shown in FIGS. 2–43, the error space is halved at each successive clock edge or decision point. An initial approximation is a half scale estimate generated by turning on the MSB to be $2^{N-1}$* LSB, where N is the number of output bits in the approximation. At a first decision point, a next bit $2^{N-2}$*LSB is added to the approximation, and the LOW__HIB signal determines whether to leave the MSB in the approximation or to remove it thereof.

The successive approximation circuit 12 is configured such that, before the next decision point, a current maximum possible error is equal to the sum of the previous maximum possible error plus (SLEW RATE×CLK$_{13}$ PERIOD), where the SLEW RATE of the input signal is predetermined. In operation, the bit control circuit 30 either adds or subtracts an adjustment value to the current output bit values which is closest to one half of the current maximum possible error, where the current bit values are added and adjusted for an additional LSB as well as the current count value, since one period slew rate error is defined to be less than one LSB. The LOW__HIB signal determines whether addition or subtraction is performed.

Alternatively, before the $i^{th}$ iteration of the successive approximation, the added or subtracted value is the current value, which is $2^{N-i}$*LSB. The bit control circuit 30 is configured such that, if the current value is greater that (⅓)*(the current maximum possible error) then the current bit is set, corresponding to adding the value $2^{N-i}$. The LOW__HIB then determines whether to retain or remove the last entered bit.

Figure 6:
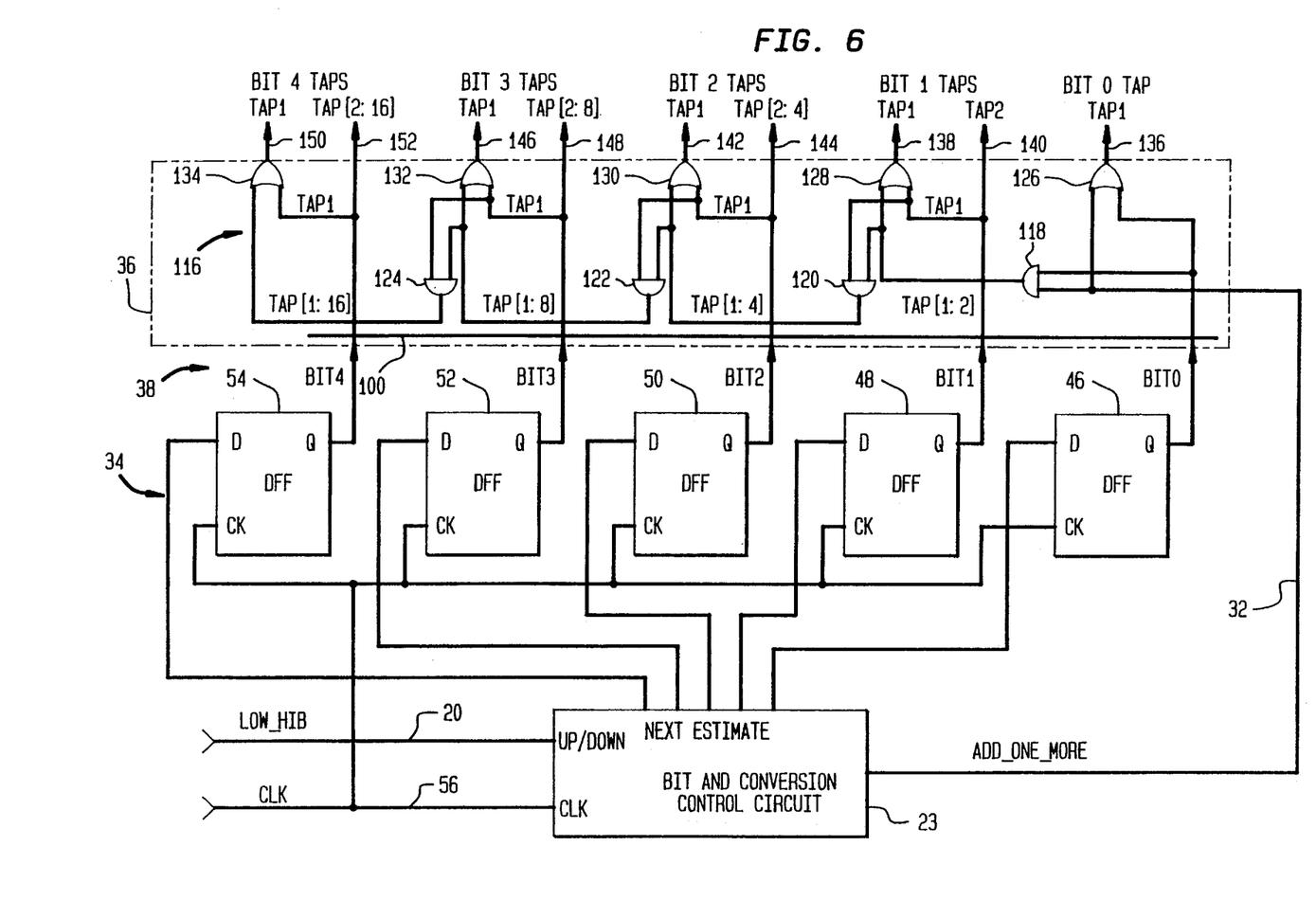
FIG. 6 illustrates a third embodiment of the bit tap circuit for use with the successive approximation circuit.

However, if the current value is less than (⅓)*(the current maximum possible error), then add or subtract the value entered last time; i.e. $2^{N-i+1}$*LSB. Subtraction is accomplished by simply taking out the bit put in last time, and addition is performed using the AND-OR-XOR chains shown in FIG. 3, where addition or subtraction is performed according to LOW__HIB. FIGS. 4–6 illustrates a first embodiment of the bit tap circuit for use in the successive approximation circuit for reducing noise in the approximation. As shown in FIGS. 4–6, in conjunction with FIG. 1, the bit tap circuit 36 is provided which includes a tap converter 100 and an adjustment circuit. The tap converter 100 responds to the plurality of output bits 58 and the ADD__ONE__MORE signal 32 as an adjustment signal from the bit and conversion control circuit 23, for generating a first plurality of bit taps. In an exemplary embodiment, the bit taps 40 are generated from a respective output bit by fanning out the output bit. In particular, for BIT0, bit tap 0 has one tap, TAP1, which is turned on when BIT0 is high. Similarly, each output bit BIT i turns on $2^i$ bit taps labeled [1, $2^i$] when BIT i is high. In the exemplary embodiments shown in FIGS. 4–6, five output bits BIT0–BIT4 are generated, with, for example, BIT4 turning on bit taps [1,16] with a first bit tap 102 labelled TAP1 and the remaining bit taps 104 labelled [2,16].

As shown in FIG. 1, the adjustment circuit adjusts the next-to-last plurality of bit taps to generate a final plurality of bit taps having reduced noise as the approximated moving signal.

FIG. 4 illustrates a first embodiment of the bit tap circuit 36 of FIG. 1 for use in the successive approximation circuit 12 to reduce noise in the approximation, where the adjustment circuit converts the adjustment signal to generate an extra least significant bit (LSB) tap 106 of the second plurality of bit taps. Referring to FIG. 4, the ADD__ONE__MORE signal 32 from the bit and conversion control circuit 23 is provided to generate the extra LSB tap 106 by the adjustment circuit 108.

FIG. 5 illustrates a second embodiment of the bit tap circuit 36 of FIG. 1 for use in the successive approximation circuit 12, where the adjustment circuit converts the adjustment signal to generate a first bit tap of the last plurality of bit taps corresponding to a most significant bit (MSB) of the plurality of output bits 58. Referring to FIG. 5, the ADD__ONE__MORE signal 32 from the bit and conversion control circuit 23 is provided to adjustment circuit 110 to generate a first bit tap 112 as TAP 1 of BIT4, which is the MSB, and the tap converter 100 generates the remaining 15 bit taps 104 labelled [2:16] generated from BIT4.

FIG. 6 illustrates a third embodiment of the bit tap circuit 36 of FIG. 1 for use in the successive approximation circuit 12, including the tap converter 100 (shown as a solid bar), and an adjustment circuit 116. The adjustment circuit 116 includes a plurality of AND gates in series including a first AND gate 118 and at least a second AND gate 120–124, where each AND gate is connected to a first bit tap corresponding to a respective output bit. The first AND gate 118 performs an ANDing function for ANDing the ADD__ONE__MORE signal and the first bit tap corresponding to a least significant bit (LSB) of the output bits for generating a first AND output signal. Each of the AND gates 120–124 is used for ANDing a preceding AND output signal to generate a successive AND output signal.

The adjustment circuit 116 also includes a plurality of OR gates including a first OR gate 126 and second OR gates 128–134. Each OR gate is connected to a first bit tap corresponding to a respective output bit, and the first OR gate 126 performs an ORing function for ORing the ADD_ ONE_MORE signal and the first bit tap corresponding to the LSB to generate a first bit tap of the second plurality of bit taps corresponding to the LSB. Each of OR gates 128–134 performs an ORing function for ORing a respective successive AND output signal and a respective output bit for generating a first bit tap of the second plurality of bit taps corresponding to a respective output bit.

In the above exemplary embodiments shown in FIG. 4–6, the bit tap circuits 36 provide that only an LSB changes at the last stage of approximation to avoid a noisy environment, by tapping off only one LSB portion of each binary weighted conversion bit due to the last "add one" operation.

Figure 7:
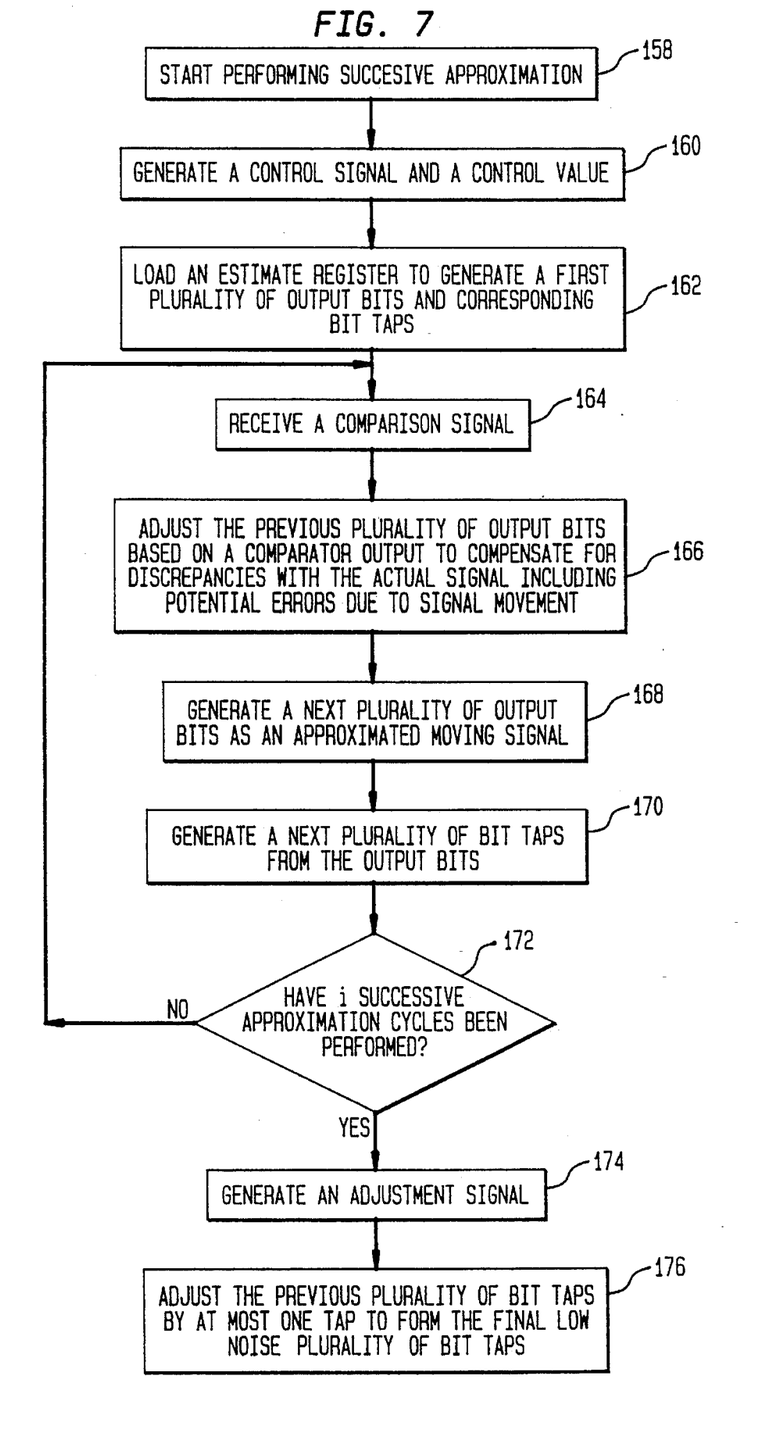
FIG. 7 illustrates the operation of the method of succession approximation and reduction of noise thereof.

As illustrated in FIG. 7 in conjunction with FIGS. 1–3, the method starts performing successive approximation in step 158 by generating a control signal and a control value in step 160; and loading data; i.e. an output of the bit and conversion control circuit 23, an estimate register in step 162 to generate a first plurality of output bits and corresponding bit taps. A comparison signal is then received from the comparator 14 in step 164, and the previous plurality of output bits are then adjusted in step 166 based on the comparator output to compensate for discrepancies with the actual signal including potential errors due to signal movement. A next plurality of output bits are generated in step 168 as an approximated moving signal, and a next plurality of bit taps are generated in step 170 from the next plurality of output bits. The method determines in step 172 whether i successive approximation cycles have been performed. If not, the method loops back to repeat steps 166–170. Once the i iterations have been performed to complete the conversion, the final plurality of output bits and corresponding bit taps have been generated.

As illustrated in FIG. 7 in conjunction with FIGS. 1 and 4–6, the method for reducing noise includes generating an adjustment signal in step 174; and adjusting the previous plurality of bit taps using the adjustment signal to generate a final plurality of bit taps having reduced noise in step 176. The adjustment to reduce noise in step 176 is performed at the final iterative cycle of the conversion procedure.

While the disclosed successive approximation circuit and method has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention. For example, the low noise concepts embodied herein, with an "add" one last LSB operation, apply equally as well to a design implementing a "subtract" operation of one last LSB.

What is claimed is:

1. A successive approximation circuit for digitally approximating a moving signal forming an analog-digital converter (ADC) receiving a comparison signal to the successive approximation circuit, the successive approximation circuit comprising:

a conversion control circuit including a decoder for generating a plurality of decoder counts as a control signal;

an estimate register for holding a current plurality of output bits; and a bit control circuit for generating a next plurality of output bits as a next input to the estimate register in response to the control signal to generate the next plurality of output bits and to generate, from the plurality of decoder counts, a control value associated with a current decoder value and a least significant bit (LSB), the bit control circuit responsive to the comparison signal for adjusting the current plurality of output bits using the control value to compensate for an error due to a slew rate and to generate a next plurality of output bits as the digitally approximated moving signal.

2. The successive approximation circuit of claim 1 wherein the bit control circuit includes an adder, responsive to the control signal, the control value generated in response to the control signal, and the comparison signal, for adding the control value to the current plurality of output bits to generate the next plurality of output bits.

3. The successive approximation circuit of claim 2 further comprising a flip-flop circuit for generating a first plurality of output bits at an output; and the adder is connected to the output of the flip-flop circuit and is responsive to the first plurality of output bits for adding the control value.

4. The successive approximation circuit of claim 1 wherein the bit control circuit generates the control value to minimize a maximum error value.

5. A successive approximation circuit for digitally approximating a moving signal forming an analog digital converter (ADC) receiving a comparison signal to the successive approximation circuit, the successive approximation circuit comprising:

a conversion control circuit for generating a control signal, the conversion control circuit for outputting the control signal, including a plurality of control bits, the conversion control circuit including an OR gate for generating a least significant bit (LSB) control output:

an estimate register for holding a current plurality of output bits; and a bit control circuit for generating a next plurality of output bits as a next input to the estimate register in response to the control signal to generate the next plurality of output bits, the bit control circuit responsive to the comparison signal for adjusting the current plurality of output bits using the control value to compensate for an error due to a slew rate and to generate a next plurality of output bits as the digitally approximated moving signal, the bit control circuit including:

an inverter for inverting the comparison signal;

a first plurality of AND gates, responsive to the inverted comparison signal, the LSB control output and the plurality of control bits, for generating AND output signals including a first, second, and at least third AND output signal, by respectively ANDing the inverted comparison signal and a respective control bit;

an adjustment selection circuit, responsive to the control signal and the first and second AND output signal, for generating a first adjustment signal; and a logic chain circuit, responsive to the at least third AND output signal and the first adjustment signal, for controlling a flip-flop circuit to add the control value to the current plurality of output bits to generate the next plurality of output bits.

6. A successive approximation circuit for digitally approximating a moving signal forming an analog-digital converter (ADC) receiving a comparison signal to the successive approximation circuit, the successive approximation circuit comprising:

a conversion control circuit for generating a control signal and for outputting the control signal, including a plurality of control bits, the conversion control circuit including an OR gate for generating a least significant bit (LSB) control output;

an estimate register for holding a current plurality of output bits;

a bit control circuit for generating a next plurality of output bits as a next input to the estimate register in response to the control signal to generate the next plurality of output bits and a control value, the bit control circuit responsive to the comparison signal for adjusting the current plurality of output bits using the control value to compensate for an error due to a slew rate and to generate a next plurality of output bits as the digitally approximated moving signal;

an inverter for inverting the comparison signal;

a first plurality of AND gates, responsive to the inverted comparison signal, the LSB control output and the plurality of control bits, for generating AND output signals including a first, second, and at least third AND output signal, by respectively ANDing the inverted comparison signal and a respective control bit;

an adjustment selection circuit, responsive to the control signal and the first and second AND output signal, for generating a first adjustment signal;

flip-flop circuit including a plurality of flip-flops, each flip-flop for generating at a respective output a respective output bit of the first plurality of output bits and a respective output bit of the second plurality of output bits, each of the first and second pluralities of output bits including a least significant bit (LSB) and a most significant bit (MSB); and a logic chain circuit, responsive to the at least third AND output signal and the first adjustment signal, for controlling a flip-flop circuit to add the control value to the current plurality of output bits to generate the next plurality of output bits, the logic chain circuit further includes:
  a plurality of exclusive-OR gates, each exclusive-OR gate having a first input connected to the output of a respective flip-flop;
  a first OR gate for ORing a respective control bit and the first adjustment signal to generate a first chain OR output for input to a first exclusive-OR gate;
  a second plurality of AND gates in series, a first AND gate for ANDing a first output bit and the first adjustment signal, and each successive AND gate in series for ANDing a respective output bit and an output of a preceding AND gate to generate a respective chain AND output; and
  at least a second OR gate, each OR gate for ORing a respective control bit, a respective AND output signal, and a respective chain AND output to generate at least a second chain OR output for input to a respective exclusive-OR gate.

7. A successive approximation circuit for digitally approximating a moving signal and for reducing noise in the approximation, the successive approximation circuit comprising:

a flip-flop circuit for generating a plurality of output bits; and a bit control circuit, responsive to an input comparison signal, for controlling the flip-flop circuit to generate the plurality of output bits and for generating an adjustment signal; and a bit tap circuit including:
  a tap converter, responsive to the plurality of output bits and the adjustment signal, for fanning out the output bits for generating a first plurality of bit taps; and
  an adjustment circuit for adjusting a next-to-last plurality of bit taps to generate a final plurality of bit taps at an output having reduced noise as the output approximated moving signal.

8. The successive approximation circuit of claim 7 wherein the adjustment circuit converts the adjustment signal to generate an extra least significant bit (LSB) tap of the final plurality of bit taps.

9. The successive approximation circuit of claim 7 wherein the adjustment circuit converts the adjustment signal to generate a first bit tap of the final plurality of bit taps corresponding to a most significant bit (MSB) of the plurality of output bits.

10. A successive approximation circuit for digitally approximating a moving signal and for reducing noise in the approximation, the successive approximation circuit comprising:

a flip-flop circuit for generating a plurality of output bits; and a bit control circuit, responsive to an input comparison signal, for controlling the flip-flop circuit to generate the plurality of output bits and for generating an adjustment signal; and a bit tap circuit including:
  a tap converter, responsive to the plurality of output bits and the adjustment signal, for generating a first plurality of bit taps; and
  an adjustment circuit for adjusting a next-to-last plurality of bit taps to generate a final plurality of bit taps having reduced noise as the approximated moving signal, wherein the adjustment circuit includes:
    a plurality of AND gates in series including a first AND gate and at least a second AND gate, each AND gate connected to a first bit tap corresponding to a respective output bit, a first AND gate for ANDing the adjustment signal and the first bit tap corresponding to a least significant bit (LSB) of the output bits for generating a first AND output signal, each of the at least second AND gate for ANDing a preceding AND output signal to generate a successive AND output signal; and
    a plurality of OR gates including a first OR gate and at least a second OR gate, each OR gate connected to a first bit tap corresponding to a respective output bit, a first OR gate for ORing the adjustment signal and the first bit tap corresponding to the LSB to generate a first bit tap of the final plurality of bit taps corresponding to the LSB, each of the at least second OR gates for ORing a respective successive AND output signal and a respective output bit for generating a first bit tap of the second plurality of bit taps corresponding to a respective output bit.

11. A method for performing a successive approximation of a moving signal using an analog-digital converter (ADC) comprising the steps of:

a) receiving a clock signal;

b) generating a control signal including a plurality of decoder counts from a decoder in response to the clock signal;

c) generating a control value associated with a current decoder value and a least significant bit (LSB) in response to the control signal, including a plurality of decoder counts;

d) loading data to an estimate register to generate a first plurality of output bits and corresponding bits taps;

e) receiving a comparison signal from a comparator;

f) adjusting a previous plurality of output bits using the comparison signal to compensate for a discrepancy with actual signal including an error associated with a slew rate due to signal movement;

g) generating a next plurality of output bits as an approximated moving signal; and h) repeating steps (a) to (g) at least i times for an i bit conversion.

12. A method for performing a successive approximation of a moving signal using an analog-digital converter (ADC) comprising the steps of:

a) receiving a clock signal;

b) generating a control signal from the clock signal including the step of:

b1) generating a plurality of control bits;

c) generating a control value in response to the control signal;

d) loading data to an estimate register to generate a first plurality of output bits and corresponding bits taps;

e) receiving a comparison signal from a comparator;

f) adjusting a previous plurality of output bits using the comparison signal to compensate for a discrepancy with actual signal including an error due to signal movement, the step of adjusting includes the steps of:

f1) inverting the comparison signal;

f2) generating AND output signals including a first, second, and at least third AND output signal, by respectively ANDing the inverted comparison signal and a respective control bit with a respective AND gate;

f3) generating a first adjustment signal from the control signal and the first and second AND output signals; and f4) controlling flip-flop circuit using the at least third AND output signal and the first adjustment signal to compensate for the error;

g) generating a next plurality of output bits as an approximated moving signal; and h) repeating steps (a) to (g) at least i times for an i bit conversion.

13. The method of claim 12 wherein the step of generating the second plurality of bits includes the step of adding a control value to the first plurality of output bits.

14. The method of claim 13 wherein the step of controlling the flip-flop circuit includes the steps of:

ORing a respective control bit and the first adjustment signal;

ANDing a first output bit and the first adjustment signal;

ANDing, in an AND gate chain, a respective output bit and an output of a preceding AND gate to generate a respective chain AND output;

ORing a respective control bit, a respective AND output signal, and a respective chain AND output to generate a respective chain OR output; and exclusive-ORing a respective output bit and a respective chain OR output to control a respective flip-flop in the flip-flop circuit.

15. The method of claim 11 wherein the step of generating the control value includes the step of halving a maximum error value.

16. The method of claim 11 wherein the step of adjusting includes the step of adding the control value to the previous plurality of output bits to generate the next plurality of output bits.

17. A method for reducing noise in digitally approximating a moving signal in a successive approximation circuit, the method comprising the steps of:

receiving an input comparison signal;

generating a plurality of output bits using the input comparison signal;

generating at least one previous plurality of bit taps by fanning out the plurality of output bits;

generating an adjustment signal;

adjusting the at least one previous plurality of bit taps using the adjustment signal to generate a final plurality of bit taps at an output having reduced noise as the output approximated moving signal.

18. The method of claim 17 wherein the step of adjusting includes the step of converting the adjustment signal to an extra least significant bit (LSB) tap of the final plurality of bit taps.

19. The method of claim 17 wherein the step of adjusting includes the step of converting the adjustment signal to a first bit tap of the final plurality of bit taps corresponding to a most significant bit (MSB) of the plurality of output bits.

20. The method of claim 17 wherein the step of adjusting includes the steps of:

ANDing the adjustment signal and the first bit tap corresponding to a least significant bit (LSB) of the output bits to generate a first AND output signal;

ANDing a preceding AND output signal to generate a successive AND output signal; and ORing the adjustment signal and the first bit tap corresponding to the LSB to generate a first bit tap of the second plurality of bit taps corresponding to the LSB;

ORing a respective successive AND output signal and a respective output bit for generating a first bit tap of the final plurality of bit taps corresponding to a respective output bit.

* * * * *